(12) United States Patent
Gupta et al.

(10) Patent No.: US 8,334,455 B2
(45) Date of Patent: Dec. 18, 2012

(54) PHOTOVOLTAIC DEVICES INCLUDING MG-DOPED SEMICONDUCTOR FILMS

(75) Inventors: Akhlesh Gupta, Sylvania, OH (US);
Rick C. Powell, Ann Arbor, MI (US);
David Eaglesham, Perrysburg, OH (US)

(73) Assignee: First Solar, Inc., Perrysburg, OH (US)

( * ) Notice: Subject to any disclaimer, the term of this patent is extended or adjusted under 35 U.S.C. 154(b) by 301 days.

(21) Appl. No.: 12/507,793

(22) Filed: Jul. 22, 2009

(65) Prior Publication Data

US 2010/0059112 A1    Mar. 11, 2010

Related U.S. Application Data

(60) Provisional application No. 61/083,325, filed on Jul. 24, 2008.

(51) Int. Cl.
*H01L 31/00* (2006.01)
*H01L 21/00* (2006.01)

(52) U.S. Cl. ............................ 136/260; 136/256; 438/95

(58) Field of Classification Search .................. 136/260, 136/256; 438/95
See application file for complete search history.

(56) References Cited

U.S. PATENT DOCUMENTS

| | | | | |
|---|---|---|---|---|
| 4,287,383 | A | * | 9/1981 | Peterson ..................... 136/260 |
| 4,342,879 | A | * | 8/1982 | Catalano et al. .............. 136/265 |
| 4,556,788 | A | * | 12/1985 | Hanak ........................ 250/203.4 |
| 4,633,032 | A | * | 12/1986 | Oido et al. ..................... 136/251 |
| 5,501,744 | A | | 3/1996 | Albright et al. |
| 6,172,296 | B1 | | 1/2001 | Iwasaki et al. |
| 6,534,704 | B2 | | 3/2003 | Hashimoto et al. |
| 2005/0257824 | A1 | * | 11/2005 | Maltby et al. ................. 136/252 |

OTHER PUBLICATIONS

International Preliminary Report on Patentability, International Application No. PCT/US2009/051703.

* cited by examiner

*Primary Examiner* — Basia Ridley
*Assistant Examiner* — Allison Bourke
(74) *Attorney, Agent, or Firm* — Dickstein Shapiro LLP

(57) ABSTRACT

A photovoltaic cell can include a dopant in contact with a semiconductor layer.

15 Claims, 4 Drawing Sheets

Mg%: increasing order from a to e
CdS Thick: increasing thickness from A to C

Temp: Temperature increasing order, std-Hot-High
CdS Thick: Thickness increasing order, thinner-thin-std

PHOTOVOLTAIC DEVICES INCLUDING MG-DOPED SEMICONDUCTOR FILMS

CLAIM FOR PRIORITY

This application claims priority under 35 U.S.C. §119(e) to Provisional U.S. Patent Application Ser. No. 61/083,325 filed on Jul. 24, 2008, which is hereby incorporated by reference.

TECHNICAL FIELD

This invention relates to photovoltaic cells.

BACKGROUND

During the fabrication of photovoltaic devices, layers of semiconductor material can be applied to a substrate with one layer serving as a window layer and a second layer serving as the absorber layer. The window layer can allow the penetration of solar energy to the absorber layer, where the optical energy is converted into electrical energy. Some photovoltaic devices can use transparent thin films that are also conductors of electrical charge. The conductive thin films can be a transparent conductive oxide (TCO), such as fluorine-doped tin oxide, aluminum-doped zinc oxide, or indium tin oxide. The TCO can allow light to pass through a substrate window to the active light absorbing material and also serves as an ohmic contact to transport photogenerated charge carriers away from the light absorbing material. A back electrode can be formed on the back surface of a semiconductor layer. The back electrode can include electrically conductive material, such as metallic silver, nickel, copper, aluminum, titanium, palladium, or any practical combination thereof, to provide electrical connection to the semiconductor layer. The back electrode can be a semiconductor material. Doping the semiconductor layer can improve the efficiency of a photovoltaic device.

SUMMARY

In general, a photovoltaic cell can include a transparent conductive layer and a first semiconductor layer in contact with the transparent conductive layer, the first semiconductor layer including magnesium. In certain circumstances, a substrate can be a glass substrate. In other circumstances, a substrate can be a metal layer.

The first semiconductor layer can include CdS. The first semiconductor layer can have a thickness of between about 200-3000 Angstroms. The first semiconductor layer can include 1-20% magnesium. In some circumstances, a transparent conductive layer can be positioned over a substrate. In some circumstances, a transparent conductive layer can be positioned over the first semiconductor layer. In some circumstances, the photovoltaic cell can further include a second semiconductor layer in contact with the first semiconductor layer. The second semiconductor layer can include CdTe. The second semiconductor layer can include cadmium chloride-treated CdTe.

A method of manufacturing a photovoltaic cell can include providing a transparent conductive layer and depositing a first semiconductor layer in contact with the transparent conductive layer, the first semiconductor layer treated with magnesium. The second semiconductor layer can be treated with cadmium chloride. The second semiconductor layer can be treated with heat at approximately 380-450 degrees Celsius.

A system for generating electrical energy can include a transparent conductive layer, a first semiconductor layer in contact with the transparent conductive layer, the first semiconductor layer treated with magnesium, a first electrical connection connected to a transparent conductive layer, and a second electrical connection connected to a back metal electrode adjacent to a second semiconductor layer. The first semiconductor layer can include CdS. The first semiconductor layer can include 1-20% magnesium. In some circumstances, a transparent conductive layer can be positioned over a substrate. The transparent conductive layer can be positioned over the first semiconductor layer. In some circumstances, the photovoltaic cell can further include a second semiconductor layer in contact with the first semiconductor layer. The second semiconductor layer can include CdTe. The second semiconductor layer can include cadmium chloride-treated CdTe.

DETAILED DESCRIPTION

A photovoltaic cell can include a transparent conductive layer on a surface of the substrate and a first semiconductor layer including magnesium. In general, treatment with magnesium allows for a thinner semiconductor layer to be used, more robust heat treatment conditions, and improved device performance.

Figure 1:
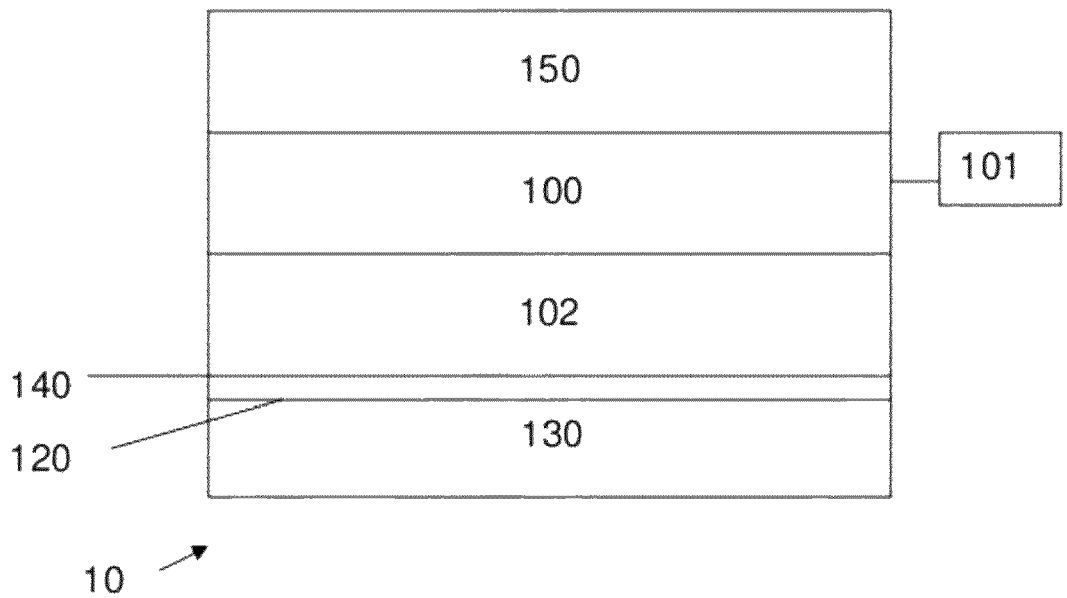
FIG. 1 is a schematic of a substrate with multiple layers.

Referring to FIG. 1, a photovoltaic cell can include a first semiconductor layer 100 can include CdS, for example. The first semiconductor layer, such as a CdS layer, can be treated with magnesium 101. The CdS layer can include 1-20% magnesium, for example. Optionally, another dopant 102 can also be added to treat the layer. The transparent conductive layer can include a transparent conductive oxide (TCO). The magnesium or other dopant can be supplied by a source such as a carrier gas or by diffusion, either from the substrate 130, from the TCO 120 itself, or from a surface layer 140 on the TCO. A second semiconductor layer 150 can be deposited over a first semiconductor layer. A second semiconductor layer can include CdTe, for example.

Figure 2:
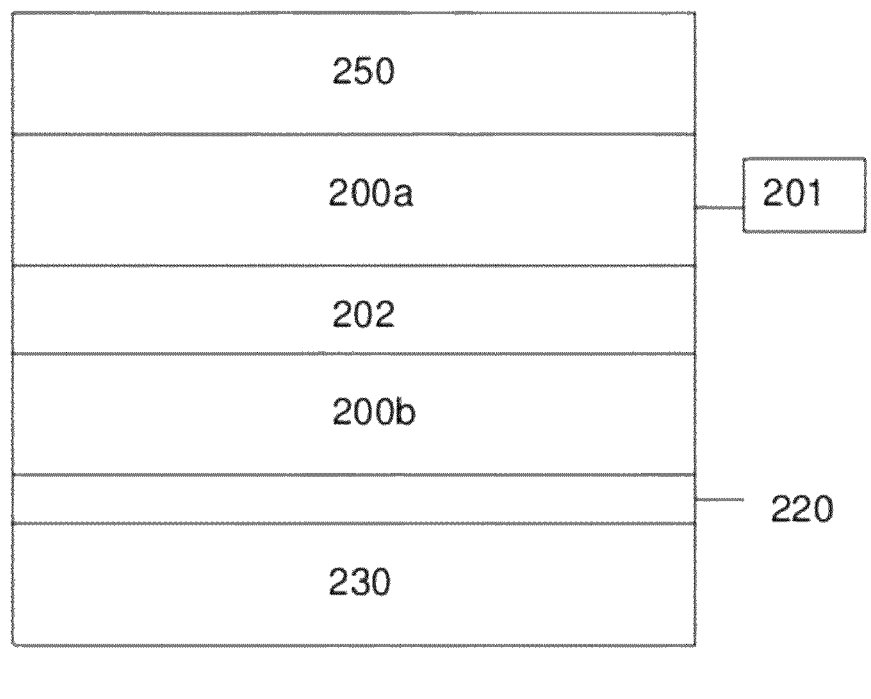
FIG. 2 is a schematic of a substrate with multiple layers.

Referring to FIG. 2, a first semiconductor layer, such as a CdS layer, can be treated with magnesium 201 or other dopant. The magnesium or other dopant can supplied by a source such as a carrier gas or by diffusion, either from the substrate 230, from the TCO 220 itself, or from a surface layer on the TCO. The dopant can form a layer 202 between a first semiconductor layer 200a and an additional first semiconductor layer 200b. A layer containing a dopant can include 1-20% magnesium, for example. The first semiconductor layer 200a can have a thickness greater than a thickness of the additional first semiconductor layer 200b. For example, the thickness of the first semiconductor layer can be greater than 200 Angstroms, greater than greater than 400 Angstroms, and greater than 800 Angstroms, or approximately 900 Angstroms. The thickness of the additional first semiconductor layer can be greater than 50 Angstroms, greater than 75 Angstroms, or approximately 100 Angstroms. A second semiconductor layer 250 can be deposited over a first semiconductor layer. A second semiconductor layer can be treated with magnesium or alternatively, with another dopant. A second semiconductor layer can include CdTe, for example. A dopant layer can have a thickness greater than 4 Angstroms, greater than 8 Angstroms, greater than 12 Angstroms, or approximately 15 Angstroms, for example.

Figure 3:
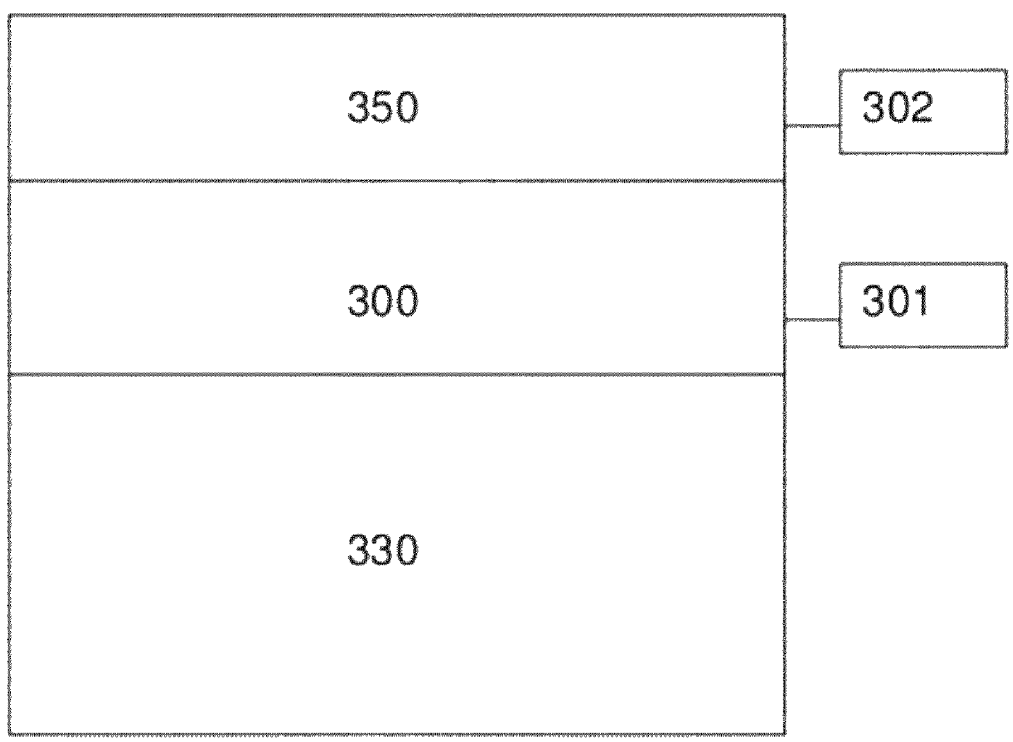
FIG. 3 is a schematic of a substrate with multiple layers.

Referring to FIG. 3, a photovoltaic device can include a first semiconductor layer 300 treated with magnesium 301 and a second semiconductor layer 350. The first semiconductor layer can be supported by a substrate 330. Optionally, the second semiconductor layer can be treated with another dopant 302. The first and second dopants can be added intentionally as extrinsic dopants.

Typically, photovoltaic cell efficiency depends on at least three parameters: open-circuit voltage, short-circuit density, and fill factor. Open-circuit voltage (Voc) is the voltage for which the current in the external circuit is zero. Short-circuit current density (Jsc) is the current density that flows out of the solar cell at zero bias. The fill factor (FF) is the ratio of the maximum power point divided by the open circuit voltage (Voc) and the short circuit current (Jsc).

Increased Jsc results in increased photovoltaic cell efficiency. Jsc can be increased by reducing the thickness of a semiconductor layer, such as a CdS layer. However, if the thickness of a CdS layer is reduced below a certain limit, the Voc can be adversely affected, resulting in decreased cell efficiency. Conventionally, high resistive oxide layers between the TCO and CdS layers have been used to overcome this problem. Yet, even with high resistive oxides, a CdS thickness of approximately 1000 Angstroms is typically required to make effective CdS/CdTe junctions for high efficiency cells.

Processing of photovoltaic cells typically involves heat treatment of CdTe coated plates with cadmium chloride. Cadmium chloride can be applied by various techniques, such as by solution spray, vapors, or atomized mist. CdTe can also be applied by various techniques, such as eletrodeposition, sputtering, close spaced sublimation, screen printing, evaporation, and vapor transport deposition. A heat treatment temperature of 380-450 degrees Celsius is generally most effective regardless of the CdTe deposition technique. Generally, temperatures lower than 380 degrees can result in photovoltaic cells with reduced initial Voc and FF. Temperatures higher than 450 degrees can also result in photovoltaic cells with reduced Voc and FF, but with a higher Jsc. The increase in Jsc is generally attributed to the diffusion of CdS into a CdTe layer, which can decrease the effective CdS thickness, thereby further reducing Voc.

Applicants have discovered that a modified doping of CdS, such as by doping with magnesium, can overcome Voc loss due to a thinner CdS layer. Magnesium-doping of CdS can also reduce device sensitivity to variation in $CdCl_2$ treatment temperatures and reduce the loss of device performance at higher $CdCl_2$ temperatures.

As shown in Table 1, experiments have shown that treatment of cadmium sulfide with magnesium (CdS:Mg), when used in CdTe photovoltaic cells, exhibited the following results, indicating that CdS thickness can be reduced, thereby permitting increase Jsc without a loss of Voc. Higher heat treatments can also be applied without resulting in a reduced Voc.

TABLE 1

|  | control | magnesium treatment |
|---|---|---|
| CdS thickness required without losing Voc | ~1000 Angstroms | 500-700 Angstroms |
| Heat permitted without reducing Voc | 395-410 degrees Celsius | 430-450 degrees Celsius |

Figure 4:
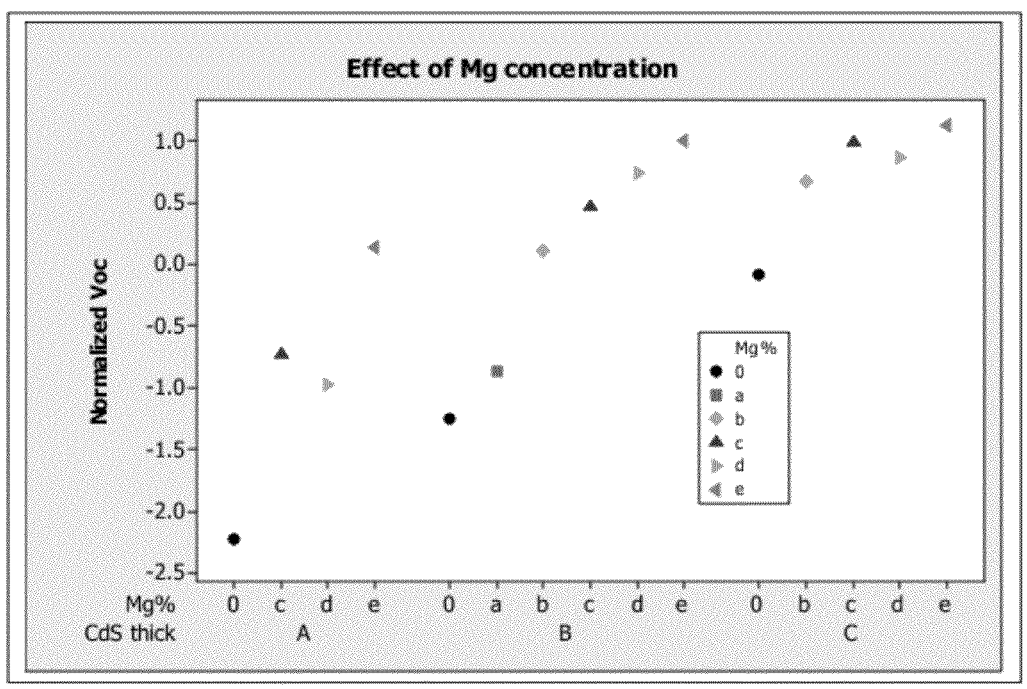
FIG. 4 is a graph showing the effect of increasing Mg concentration.
Figure 5:
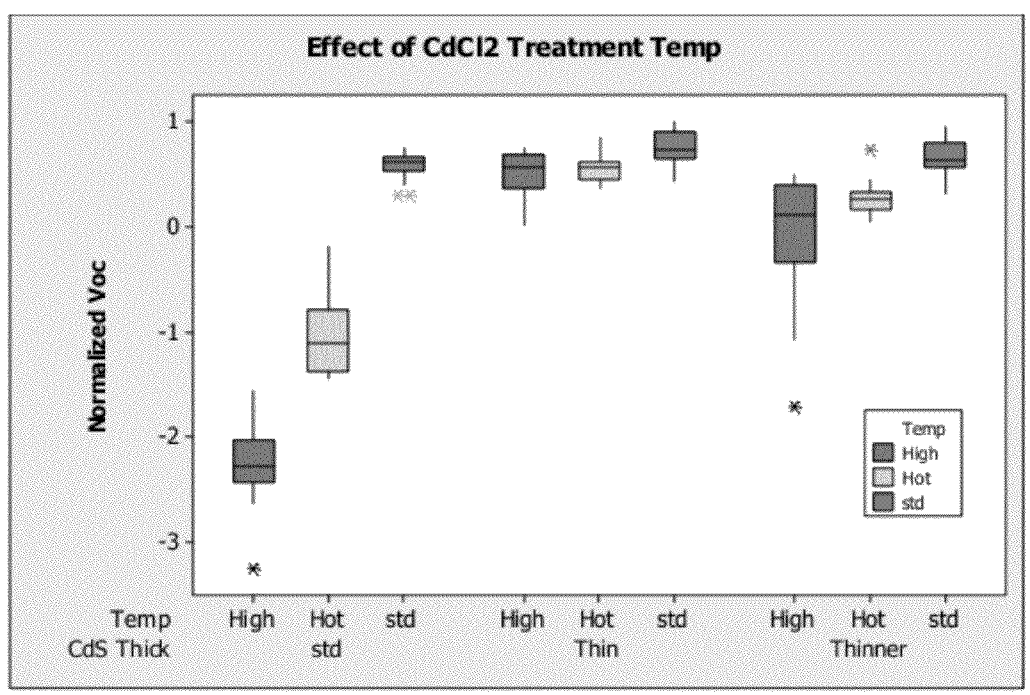
FIG. 5 is a graph showing the effect of $CdCl_2$ treatment temperature.

Referring to FIG. 4 and FIG. 5, photovoltaic cells treated having a magnesium-treated CdS layer proved to be more robust against cadmium chloride treatment temperature variations when compared to cells with an undoped CdS layer. In addition, photovoltaic cells having a magnesium-treated CdS layer achieved higher average Voc than cells with undoped CdS layers. Further, among photovoltaic cells having a CdS layer treated with magnesium, an increased concentration of magnesium was directly related to an increased Voc.

Photovoltaic cells are often processed without any intentional extrinsic dopants in a first semiconductor layer, such as a CdS containing layer, or without any extrinsic dopants in a second semiconductor layer, such as CdTe layer, or both. Doping the first semiconductor layer with magnesium can reduce photovoltaic cell instability and increase efficiency.

Doping a semiconductor layer can be performed in several ways. For example, a dopant can be supplied from an incoming powder, such as a mixed powder, a carrier gas, or a directly doped powder such as CdS powder. The powder can be a single or multiple phase material. In other circumstances, a dopant can be supplied by diffusion from a layer, such as a substrate layer, a transparent conductive layer, or a semiconductor layer. A dopant may be added throughout a semiconductor layer, or through a portion of a layer.

A dopant for a first semiconductor layer, such as CdS, can be added by diffusion from the transparent conductive layer or from a surface layer on the transparent conductive layer. Alternatively, a dopant for the first semiconductor layer can be added by an incoming powder or carrier gas fed into a vapor transport deposition system. A dopant for a first semiconductor layer can be volatilized along with the first semiconductor at temperatures less than 1500° C., less than 1400° C., less than 1200° C., less than 1000° C., or less than 800° C., for example. The volatile species can be atomic or a sulfide molecule, such as $In_2S$. Indium can be an effective dopant because it has a reasonably vapor pressure at typical CdS distributor temperatures (approximately 1100° C.).

Doping a second semiconductor layer, such as CdTe, can be performed in several ways. For example, a dopant can be supplied along with a CdTe source powder into a vapor transport deposition (VTD) distributor system. The dopant for a second semiconductor layer can be introduced as a powder (i.e. a single or multiple phase material) or in a carrier gas. Alternatively, a dopant for a second semiconductor layer can be introduced by deposition of an outer layer onto the second semiconductor layer. For example, an outer layer may contain a dopant, which can diffuse onto a CdTe surface.

P-type doping can be effective for a second semiconductor layer, such as CdTe. Group V (for example, N, P, As, Sb, or Bi) and Group I (for example, Li, Na, K, Rb, Cs, Cu, Ag, or Au) elements can be effective dopants for a second semiconductor layer. Phosphorous (P), arsenic (As), antimony (Sb), sodium (Na), potassium (K), rubidium (Rb) present no vaporization problems when introduced into the VTD system operating at typical CdTe distributor temperatures (approximately 900-1100° C.).

A dopant for a second semiconductor layer can be introduced during heat treatment. Heat treatment can be performed with $CdCl_2$ flux. Group I and Group V species such as chloride compounds, can be added to the flux solution that is applied to an outer surface of the second semiconductor layer prior to heat treatment. During heat treatment, recrystallization can occur, thereby making doping distribution within the film possible.

Dopant incorporation can be affected by the concentration of vacancy defects. Vacancy concentration can be controlled by vapor phase overpressure. For example, excess Cd or Te can be applied to alter electronic defects in the final device. Cd or Te overpressure can be achieved by introduction of excess Cd or Te in the CdTe source powder. This can be achieved by a two-phase powder blend or by an off-stoichiometric source material. A material can be off-stoichiometric by greater than 5%, greater than 10%, or greater than 15%, such as approximately 20%.

A dopant can be applied in any concentration, for example, greater than 0.5 ppma, greater than 50 ppma, greater than 500 ppma, or between 1-1000 ppma, for example. Certain gas source dopants, such as those containing nitrogen, for example, may decompose too readily in a heated CdTe distributor, and thus, can be introduced in a secondary, lower temperature distribution system. Dopants can be added throughout an entire semiconductor layer, or into only a portion of the layer by using multi-layer VTD configuration, for example.

A first semiconductor layer, such as a CdS layer, can be treated with a dopant such as magnesium in several ways, for example, by diffusion from the transparent conductive layer or from a surface layer on the transparent conductive layer. Alternatively, magnesium for the first semiconductor layer can be added by an incoming powder or carrier gas fed into a vapor transport deposition system.

A second semiconductor layer, such as a CdTe layer, can also be treated with a dopant such as sodium in several ways. In one example, a CdTe layer was doped with sodium using $Na_2S$ powder and Rb. The addition of Na suggested resulted in changes in recrystallization during subsequent chloride heat treatment, suggesting that Na doping made the $CdCl_2$ recrystallization flux more active.

A CdTe layer can also be doped with P, As, Sb, Na, Rb, or Cu. In yet another example, a CdTe layer doped with Cu was shown to exhibit improved electrical signals. The addition of extra Te to the CdTe powder resulted in improved ability to dope the films. In addition, Cd-rich conditions resulted in a change in film grain structure suggesting the improved ability to dope the films.

A common photovoltaic cell can have multiple layers. The multiple layers can include a bottom layer that is a transparent conductive layer, a capping layer, a window layer, an absorber layer and a top layer. Each layer can be deposited at a different deposition station of a manufacturing line with a separate deposition gas supply and a vacuum-sealed deposition chamber at each station as required. The substrate can be transferred from deposition station to deposition station via a rolling conveyor until all of the desired layers are deposited. Additional layers can be added using other techniques such as sputtering. Electrical conductors can be connected to the top and the bottom layers respectively to collect the electrical energy produced when solar energy is incident onto the absorber layer. A top substrate layer can be placed on top of the top layer to form a sandwich and complete the photovoltaic cell.

The bottom layer can be a transparent conductive layer, and can be, for example, a transparent conductive oxide such as tin oxide or tin oxide doped with fluorine. Deposition of a semiconductor layer at high temperature directly on the transparent conductive oxide layer can result in reactions that negatively impact of the performance and stability of the photovoltaic device. Deposition of a capping layer of material with a high chemical stability (such as silicon dioxide, dialuminum trioxide, titanium dioxide, diboron trioxide and other similar entities) can significantly reduce the impact of these reactions on device performance and stability. The thickness of the capping layer should be minimized because of the high resistivity of the material used. Otherwise a resistive block counter to the desired current flow may occur. A capping layer can reduce the surface roughness of the transparent conductive oxide layer by filling in irregularities in the surface, which can aid in deposition of the window layer and can allow the window layer to have a thinner cross-section. The reduced surface roughness can help improve the uniformity of the window layer. Other advantages of including the capping layer in photovoltaic cells can include improving optical clarity, improving consistency in band gap, providing better field strength at the junction and providing better device efficiency as measured by open circuit voltage loss. Capping layers are described, for example, in U.S. Patent Publication 20050257824, which is incorporated by reference in its entirety.

The window layer and the absorbing layer can include, for example, a binary semiconductor such as group II-VI, III-V or IV semiconductor, such as, for example, ZnO, ZnS, ZnSe, ZnTe, CdO, CdS, CdSe, CdTe, MgO, MgS, MgSe, MgTe, HgO, HgS, HgSe, HgTe, MnO, MnS, MnTe, AlN, AlP, AlAs, AlSb, GaN, GaP, GaAs, GaSb, InN, InP, InAs, InSb, TlN, TlP, TlAs, TlSb, or mixtures thereof. An example of a window layer and absorbing layer is a layer of CdS coated by a layer of CdTe. A top layer can cover the semiconductor layers. The top layer can include a metal such as, for example, aluminum, molybdenum, chromium, cobalt, nickel, titanium, tungsten, or alloys thereof. The top layer can also include metal oxides or metal nitrides or alloys thereof.

Deposition of semiconductor layers in the manufacture of photovoltaic devices is described, for example, in U.S. Pat. Nos. 5,248,349, 5,372,646, 5,470,397, 5,536,333, 5,945,163, 6,037,241, and 6,444,043, each of which is incorporated by reference in its entirety. The deposition can involve transport of vapor from a source to a substrate, or sublimation of a solid in a closed system. An apparatus for manufacturing photovoltaic cells can include a conveyor, for example a roll conveyor with rollers. Other types of conveyors are possible. The conveyor transports substrate into a series of one or more deposition stations for depositing layers of material on the exposed surface of the substrate. Conveyors are described in provisional U.S. application Ser. No. 11/692,667, which is hereby incorporated by reference.

The deposition chamber can be heated to reach a processing temperature of not less than about 450° C. and not more than about 700° C., for example the temperature can range from 450-550° C., 550-650° C., 570-600° C., 600-640° C. or any other range greater than 450° C. and less than about 700° C. The deposition chamber includes a deposition distributor connected to a deposition vapor supply. The distributor can be connected to multiple vapor supplies for deposition of various layers or the substrate can be moved through multiple and various deposition stations with its own vapor distributor and supply. The distributor can be in the form of a spray nozzle with varying nozzle geometries to facilitate uniform distribution of the vapor supply.

The bottom layer of a photovoltaic cell can be a transparent conductive layer. A thin capping layer can be on top of and at least covering the transparent conductive layer in part. The next layer deposited is the first semiconductor layer, which can serve as a window layer and can be thinner based on the use of a transparent conductive layer and the capping layer. The next layer deposited is the second semiconductor layer, which serves as the absorber layer. Other layers, such as layers including dopants, can be deposited or otherwise placed on the substrate throughout the manufacturing process as needed.

The transparent conductive layer can be a transparent conductive oxide, such as a metallic oxide like tin oxide, which can be doped with, for example, fluorine. This layer can be deposited between the front contact and the first semiconductor layer, and can have a resistivity sufficiently high to reduce the effects of pinholes in the first semiconductor layer. Pinholes in the first semiconductor layer can result in shunt formation between the second semiconductor layer and the first contact resulting in a drain on the local field surrounding the pinhole. A small increase in the resistance of this pathway can dramatically reduce the area affected by the shunt.

A capping layer can be provided to supply this increase in resistance. The capping layer can be a very thin layer of a material with high chemical stability. The capping layer can have higher transparency than a comparable thickness of semiconductor material having the same thickness. Examples of materials that are suitable for use as a capping layer include silicon dioxide, dialuminum trioxide, titanium dioxide, diboron trioxide and other similar entities. Capping layer can also serve to isolate the transparent conductive layer electrically and chemically from the first semiconductor layer preventing reactions that occur at high temperature that can negatively impact performance and stability. The capping layer can also provide a conductive surface that can be more suitable for accepting deposition of the first semiconductor layer. For example, the capping layer can provide a surface with decreased surface roughness.

The first semiconductor layer can serve as a window layer for the second semiconductor layer. The first semiconductor layer can be thinner than the second semiconductor layer. By being thinner, the first semiconductor layer can allow greater penetration of the shorter wavelengths of the incident light to the second semiconductor layer.

The first semiconductor layer can be a group II-VI, III-V or IV semiconductor, such as, for example, ZnO, ZnS, ZnSe, ZnTe, CdO, CdS, CdSe, CdTe, MgO, MgS, MgSe, MgTe, HgO, HgS, HgSe, HgTe, MnO, MnS, MnTe, AlN, AlP, AlAs, AlSb, GaN, GaP, GaAs, GaSb, InN, InP, InAs, InSb, TlN, TlP, TlAs, TlSb, or mixtures or alloys thereof. It can be a binary semiconductor, for example it can be CdS. The second semiconductor layer can be deposited onto the first semiconductor layer. The second semiconductor can serve as an absorber layer for the incident light when the first semiconductor layer is serving as a window layer.

Similar to the first semiconductor layer, the second semiconductor layer can also be a group II-VI, III-V or IV semiconductor, such as, for example, ZnO, ZnS, ZnSe, ZnTe, CdO, CdS, CdSe, CdTe, MgO, MgS, MgSe, MgTe, HgO, HgS, HgSe, HgTe, MnO, MnS, MnTe, AlN, AlP, AlAs, AlSb, GaN, GaP, GaAs, GaSb, InN, InP, InAs, InSb, TlN, TlP, TlAs, TlSb, or mixtures thereof.

The second semiconductor layer can be deposited onto a first semiconductor layer. A capping layer can serve to isolate a transparent conductive layer electrically and chemically from the first semiconductor layer preventing reactions that occur at high temperature that can negatively impact performance and stability. The transparent conductive layer can be deposited over a substrate.

A number of embodiments have been described. Nevertheless, it will be understood that various modifications may be made without departing from the spirit and scope of the invention. For example, the semiconductor layers can include a variety of other materials, as can the materials used for the buffer layer and the capping layer. Accordingly, other embodiments are within the scope of the following claims.

What is claimed is:

1. A photovoltaic cell comprising:
   a transparent conductive layer; and
   a first semiconductor layer comprising CdS in direct physical contact with the transparent conductive layer, the first semiconductor layer doped with magnesium.

2. The photovoltaic cell of claim 1, wherein the first semiconductor layer has a thickness of between about 200-3000 Angstroms.

3. The photovoltaic cell of claim 1, wherein first semiconductor layer is doped with 1-20% magnesium.

4. The photovoltaic cell of claim 1, wherein the transparent conductive layer is positioned over a substrate.

5. The photovoltaic cell of claim 1, wherein the transparent conductive layer is positioned over the first semiconductor layer.

6. The photovoltaic cell of claim 1, further comprising a second semiconductor layer in contact with the first semiconductor layer.

7. The photovoltaic cell of claim 6, wherein the second semiconductor layer comprises CdTe.

8. The photovoltaic cell of claim 6, wherein the second semiconductor layer is cadmium chloride-treated CdTe.

9. A system for generating electrical energy comprising:
   a transparent conductive layer;
   a first semiconductor layer comprising CdS in direct physical contact with the transparent conductive layer, the first semiconductor layer doped with magnesium;
   a first electrical connection connected to a transparent conductive layer; and
   a second electrical connection connected to a back metal electrode adjacent to a second semiconductor layer.

10. The system of claim 9, wherein first semiconductor layer includes is doped with 1-20% magnesium.

11. The system of claim 9, wherein the transparent conductive layer is positioned over a substrate.

12. A photovoltaic cell comprising:
    a transparent conductive layer positioned over a substrate;
    a first semiconductor layer in direct physical contact with the transparent conductive layer, the first semiconductor layer comprising cadmium sulfide doped with magnesium; and
    a second semiconductor layer including cadmium telluride in contact with the first semiconductor layer.

13. The photovoltaic cell of claim 12, wherein the first semiconductor layer has a thickness of between about 200-3000 Angstroms.

14. The photovoltaic cell of claim 12, wherein first semiconductor layer is doped with 1-20% magnesium.

15. The photovoltaic cell of claim 12, wherein the cadmium telluride is cadmium chloride-treated CdTe.

* * * * *

UNITED STATES PATENT AND TRADEMARK OFFICE
CERTIFICATE OF CORRECTION

PATENT NO. : 8,334,455 B2
APPLICATION NO. : 12/507793
DATED : December 18, 2012
INVENTOR(S) : Akhlesh Gupta et al.

Page 1 of 1

It is certified that error appears in the above-identified patent and that said Letters Patent is hereby corrected as shown below:

Column 8, claim 10, line 2, delete "includes".

Signed and Sealed this
Twelfth Day of March, 2013

Teresa Stanek Rea
*Acting Director of the United States Patent and Trademark Office*

UNITED STATES PATENT AND TRADEMARK OFFICE
CERTIFICATE OF CORRECTION

PATENT NO. : 8,334,455 B2
APPLICATION NO. : 12/507793
DATED : December 18, 2012
INVENTOR(S) : Akhlesh Gupta et al.

It is certified that error appears in the above-identified patent and that said Letters Patent is hereby corrected as shown below:

Column 8, line 41 (claim 10, line 2) delete "includes".

This certificate supersedes the Certificate of Correction issued March 12, 2013.

Signed and Sealed this
Ninth Day of April, 2013

Teresa Stanek Rea
*Acting Director of the United States Patent and Trademark Office*